United States Patent [19]

Kaji et al.

[11] Patent Number: 4,987,057
[45] Date of Patent: Jan. 22, 1991

[54] PHOTOINITIATOR AND PHOTOPOLYMERIZABLE COMPOSITION USING THE SAME

[75] Inventors: Makoto Kaji, Fargo, N. Dak.; Nobuyuki Hayashi, Hitachi, Japan

[73] Assignee: Hitachi Chemical Co., Ltd., Tokyo, Japan

[21] Appl. No.: 355,123

[22] Filed: May 22, 1989

Related U.S. Application Data

[63] Continuation-in-part of Ser. No. 203,455, Jun. 7, 1988, abandoned.

[30] Foreign Application Priority Data

Jun. 8, 1987 [JP] Japan .................................. 62-142914

[51] Int. Cl.$^5$ .................................................. G03C 1/70
[52] U.S. Cl. ...................................... 430/281; 430/913; 430/916; 430/919; 430/920; 430/922; 430/924; 502/167; 522/26; 522/53; 522/63; 522/65
[58] Field of Search ............... 430/281, 913, 916, 919, 430/920, 922, 924; 522/26, 53, 63, 65, 26, 53, 63, 65; 502/167

[56] References Cited

U.S. PATENT DOCUMENTS 3,479,185 11/1989 Chambers ........................... 430/282
3,764,321 10/1973 Kampfer et al. ..................... 430/340
4,058,656 11/1977 Markiewitz et al. ................ 526/312

FOREIGN PATENT DOCUMENTS 59-84936 5/1984 Japan .

*Primary Examiner*—Paul R. Michl
*Assistant Examiner*—Thori Chea
*Attorney, Agent, or Firm*—Antonelli, Terry, Stout & Kraus

[57] ABSTRACT

A photoinitiator composition comprising (1) an aminobenzylidene carbonyl compound and (2) an N-aryl-α-amino acid is suitable for use in a photo-polymerizable composition comprising (a) an addition-polymerizable compound having a boiling point of 100° C. or higher at an atmospheric pressure and (b) said photoinitiator composition.

7 Claims, No Drawings

PHOTOINITIATOR AND PHOTOPOLYMERIZABLE COMPOSITION USING THE SAME

This application is a continuation-in-part of application Ser. No. 203,445, filed June 7, 1988, now abandoned.

BACKGROUND OF THE INVENTION

This invention relates to a photoinitiator and a photopolymerizable composition using said photoinitiator.

Photopolymerizable compositions are extensively used in letterpress printing, formation of relief image, preparation of photoresist, etc. and in these uses of photopolymerizable compositions UV light source is generally used. In these fields, a system of higher sensitivity is more desirable. Particularly when a photopolymerizable composition is put to scanning exposure using laser beam, the composition is required to have a sufficiently high sensitivity to the visible rays (458 nm, 4898 nm, 514.5 nm, etc.) of argon ion laser which is the most powerful light source. In this field, photoinitiator system has repeatedly been studies so far with the aim of enhancing its sensitivity. Although a number of photoinitiator substances such as benzoin and its derivatives, substituted and unsubstituted polynuclear quinones and the like have been disclosed up to today, none of them is known to have a sufficient sensitivity to visible rays.

SUMMARY OF THE INVENTION

It is an object of this invention to provide a photoinitiator capable of giving a photopolymerizable composition having a high sensitivity to visible rays and a photopolymerizable composition having a high sensitivity to visible rays which contains said photoinitiator.

This invention provides a photoinitiator composition comprising:
(1) an aminobenzylidene carbonyl compound represented by the formula:

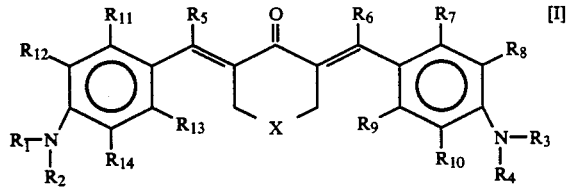

wherein $R_1$, $R_2$, $R_3$ and $R_4$ are independently an alkyl group having 1 to 6 carbon atoms; $R_5$ and $R_6$ are independently a hydrogen atom, a cyano group, an alkoxycarbonyl group having 2 to 8 carbon atoms, an alkyl group having 1 to 12 carbon atoms or an aryl group; $R_7$, $R_8$, $R_9$, $R_{10}$, $R_{11}$, $R_{12}$, $R_{13}$ and $R_{14}$ are independently a hydrogen atom, a chlorine atom, a bromine atom, an alkyl group having 1 to 12 carbon atoms, an aryl group or an alkoxy group having 1 to 12 carbon atoms; and X is an oxygen atom, a sulfur atom, —NH— or nitrogen atom substituted by an alkyl group having 1 to 12 carbon atoms, an aralkyl group having 1 to 12 carbon atoms, an aryl group, an acyl group having 1 to 12 carbon atoms, an alkoxycarbonyl group having 1 to 12 carbon atoms, an arylcarbonyl group having 7 to 20 carbon atoms, or an aryloxycarbonyl group having 7 to 20 carbon atoms, and (2) an N-aryl-α-amino acid represented by the formula:

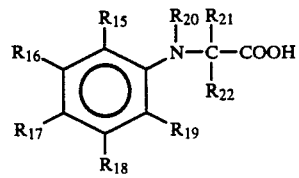

wherein $R_{15}$, $R_{16}$, $R_{17}$, $R_{18}$ and $R_{19}$ are independently a hydrogen atom, an alkyl group having 1 to 12 carbon atoms or a halogen atom; $R_{20}$ is a hydrogen atom, an alkyl group having 1 to 12 carbon atoms, a cycloalkyl group, a hydroxyalkyl group having 1 to 12 carbon atoms, an alkoxyalkyl group having 1 to 12 carbon atoms, an aminoalkyl group having 1 to 12 carbon atoms or an aryl group; and $R_{21}$ and $R_{22}$ are independently a hydrogen atom or an alkyl group having 1 to 8 carbon atoms.

This invention also provides a photopolymerizable composition comprising:
(a) an addition-polymerizable compound having a boiling point of 100° C. or above under an atmospheric pressure, and
(b) a photoinitiator composition comprising
(1) an aminobenzylidene carbonyl compound represented by the formula:

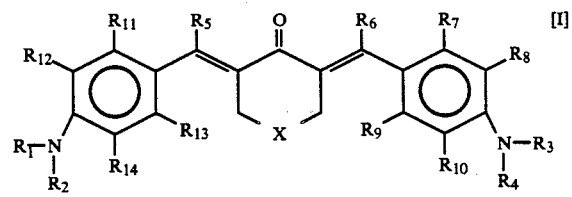

wherein $R_1$, $R_2$, $R_3$ and $R_4$ are independently an alkyl group having 1 to 6 carbon atoms; $R_5$ and $R_6$ are independently a hydrogen atom, a cyano group, an alkoxycarbonyl group having 2 to 8 carbon atoms, an alkyl group having 1 to 12 carbon atoms or an aryl group; $R_7$, $R_8$, $R_9$, $R_{10}$, $R_{11}$, $R_{12}$, $R_{13}$ and $R_{14}$ are independently a hydrogen atom, a chlorine atom, a bromine atom, an alkyl group having 1 to 12 carbon atoms, an aryl group or an alkoxy group having 1 to 12 carbon atoms; and X is an oxygen atom, a sulfur atom, —NH— or nitrogen atom substituted by an alkyl group having 1 to 12 carbon atoms, an aralkyl group having 1 to 12 carbon atoms, an aryl group, an acyl group having 1 to 12 carbon atoms, an alkoxycarbonyl group having 1 to 12 carbon atoms, an arylcarbonyl group having 7 to 20 carbon atoms, or an aryloxycarbonyl group having 7 to 20 carbon atoms, and (2) an N-aryl-α-amino acid represented by the formula:

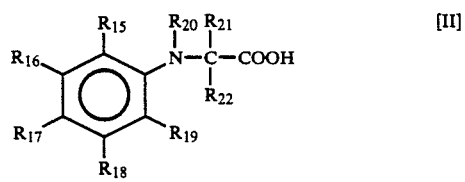

wherein $R_{15}$, $R_{16}$, $R_{17}$, $R_{18}$ and $R_{19}$ are independently a hydrogen atom, an alkyl group having 1 to 12 carbon atoms or a halogen atom; $R_{20}$ is a hydrogen atom, an alkyl group having 1 to 12 carbon atoms, a cycloalkyl group, a hydroxyalkyl group having 1 to 12 carbon atoms, an alkoxyalkyl group having 1 to 12 carbon atoms, an aminoalkyl group having 1 to 12 carbon atoms or an aryl group; and $R_{21}$ and $R_{22}$ are independently a hydrogen atom or an alkyl group having 1 to 8 carbon atoms.

DESCRIPTION OF THE PREFERRED EMBODIMENTS

The aminobenzylidene carbonyl compound used in the present invention is represented by the following formula:

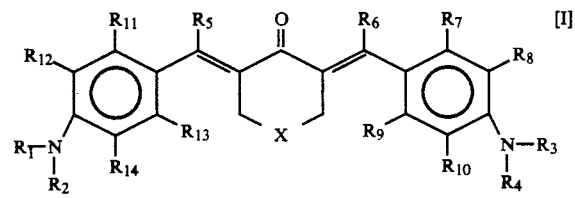

wherein $R_1$, $R_2$, $R_3$ and $R_4$ are independently an alkyl group having 1 to 6 carbon atoms; $R_5$ and $R_6$ are independently a hydrogen atom, a cyano group, an alkoxycarbonyl group having 2 to 8 carbon atoms, an alkyl group having 1 to 12 carbon atoms or an aryl group; $R_7$, $R_8$, $R_9$, $R_{10}$, $R_{11}$, $R_{12}$, $R_{13}$ and $R_{14}$ are independently a hydrogen atom, a chlorine atom, a bromine atom, an alkyl group having 1 to 12 carbon atoms, an aryl group or an alkoxy group having 1 to 12 carbon atoms; and X is an oxygen atom, a sulfur atom, —NH— or nitrogen atom substituted by an alkyl group having 1 to 12 carbon atoms, an aralkyl group having 1 to 12 carbon atoms, an aryl group, an acyl group having 1 to 12 carbon atoms, an alkoxycarbonyl group having 1 to 12 carbon atoms, an arylcarbonyl group having 7 to 20 carbon atoms, or an aryloxycarbonyl group having 7 to 20 carbon atoms.

In the above-mentioned formula [I], the term "aryl group" includes a phenyl group, a p-chlorophenyl group, a p-bromophenyl group, a p-methoxyphenyl group, a p-tolylphenyl group, a p-cyanophenyl group, etc.; the term "aralkyl group" includes a benzyl group, a phenethyl group, etc.; the term "aryloxycarbonyl group" includes a phenoxycarbonyl group, etc.; and the term "arylcarbonyl group" includes a benzoyl group, a p-chlorobenzoyl group, etc.

In this invention, an aminobenzylidene carbonyl compound represented by the above-mentioned formula [I]is used. This aminobenzylidene carbonyl compound can easily be synthesized by Aldol condensation between 4-piperidone, 4-oxacyclohexanone, 4-thiacyclohexanone, etc. and p-aminobenzaldehyde according to the method detailed in Organic Reaction Vol. 16.

Examples of said aminobenzylidene carbonyl compound include 2,6-bis(p-N,N-dimethylaminobenzylidene)-4-oxocyclohexanone, 2,6-bis(p-N,N-diethylaminobenzylidene)-4-oxocyclohexanone, 2,6-bis(p-N,N-dimethylaminobenzylidene)-4-thiacyclohexanone, 2,6-bis(p-N,N-dimethylaminobenzylidene)-4-thiacyclohexanone, 2,6-bis(p-N,N-dimethylaminobenzylidene)-4-methyl-4-azacyclohexanone, 2,6-bis(p-N,N-diethylaminobenzylidene)-4-methyl-4azacyclohexanone, 2,6-bis(p-N,N-dimethylaminobenzylidene)-4-ethyl-4-azacyclohexanone, 2,6-bis(p-N,N-diethylaminobenzylidene)-4-ethyl-4-azacyclohexanone, 2,6-bis(4'-N,N-diethylamino-2'-methoxybenzylidene)-4-oxocyclohexanone, 2,6-bis(4'-N,N-diethylamino-2'-methylbenzylidene)-4-oxocyclohexanone, 2,6-bis(4'-N,N-diethylamino-2'-methoxybenzylidene)-4-thiacyclohexanone, 2,6-bis(4'-N,N-diethylanino-2'-methylbenzylidene)-4-thiacyclohexanone, 2,6-bis(4'-N,N-diethylamino-2'-methoxybenzylidene)-4-methyl-4-azacyclohexanone, 2,6-bis(4'-N,N-diethylamino-2'-methylbenzylidene)-4-methyl-4-azacyclohexanone, 2,6-bis(4'-N,N-diethylamino-2'-methoxybenzylidene)-4azacyclohexanone, 2,6-bis(4'-N,N-diethylamino-2'-methylbenzylidene)-4-ethyl-4-azacyclohexanone, 3,5-bis(p-N,N-diethylaminophenylmethylene)-1-acetyl-4-piperidinone (K-4), 3,5-bis(p-N,N-diethylaminophenylmethylene)-1-benzoyl-4-piperidinone (K-5), 3,5-bis(p-N,N-diethylaminophenylmethylene)-1-ethoxycarbonyl-4-piperidinone (K-6), 3,5-bis(p-N,N-dimethylaminophenylmethylene)-1-acetyl-4-piperidinone, 3,5-bis(p-N,N-dimethylaminophenylmethylene)-1-propionyl-4-piperidinone, 3,5-bis(p-N,N-dimethylaminophenylmethylene)-1-butyloyl4-piperidinone, 3,5-bis(p-N,N-dimethylaminophenylmethylene)-1-benzoyl-4-piperidinone, 3,5-bis(p-N,N-dimethylaminophenylmethylene)-1-(4'-methoxybenzoyl)-4-(piperidinone, 3,5-bis(p-N,N-dimethylaminophenylmethylnene)-1-ethoxycarbonyl-4-piperidinone, 3,5-bis(p-N,N-dimethylphenylmethylene)-1-phenoxycarbonyl-4-piperidinone, 3,5-bis(4-N,N-dimethylamino-2-methylaminophenylmethylene)1-acetyl-4-piperidinone, 3,5-bis(4-N,N-di-n-butylaminophenylmethylene)-1-acetyl-4-piperidinone, and the like. Among them, the compounds of formula [I] wherein X is a nitrogen atcm substituted with an alkyl group having 1 to 12 carbcn atoms or an aralkyl group having 1 to 12 carbon atoms are preferable from the viewpoint of sensitivity.

The above-mentioned aminobenzylidene carbonyl compounds may be used either alone or in combination of two or more compounds.

In this invention, N-aryl-α-amino acids represented by the following formula [II] are also used:

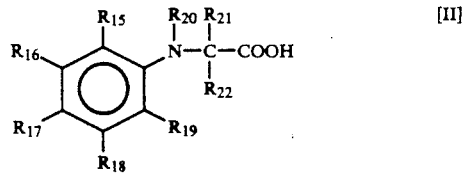

wherein $R_{15}$, $R_{16}$, $R_{17}$, $R_{18}$ and $R_{19}$ are independently a hydrogen atom, an alkyl group having 1 to 12 carbon atoms or a halogen atom; $R_{20}$ is a hydrogen atom, an alkyl group having 1 to 12 carbon atoms, a cycloalkyl group, a hydroxyalkyl group having 1 to 12 carbon atoms, an alkoxyalkyl group having 1 to 12 carbon atoms, an aminoalkyl group having 1 to 12 carbon atoms or an aryl group; and $R_{21}$ and $R_{22}$ are independently a hydrogen atom or an alkyl group having 1 to 8 carbon atoms.

The N-aryl-α-amino acid of the above-mentioned formula [II] can be synthesized by reacting an aniline compound with monochloroacetic acid, for example.

Preferable examples of the compound represented by formula [II] include N-phenylglycine, N-p-tolyl)-phenylglycine, N-(p-chloro)-phenylglycine, N-methyl-N-phenylglycine, N-ethyl-N-phenylglycine, N-(n-propyl)-N-phenylglycine, N-(n-butyl)-N-phenylglycine, N-(2-methoxyethyl)-N-phenylglycine, N-methyl-N-phenylalanine, N-ethyl-N-phenylalanine, N-(n-propyl)-N-phenylalanine, N-(n-butyl)-N-phenylalanine, N-methyl-N-phenylvaline, N-methyl-N-phenylleucine, N-methyl-N-(p-tolyl)-glycine, N-ethyl-N-(p-tolyl)-glycine, N-(n-propyl)-N-(p-tolyl) glycine, N-(n-butyl)-N-(p-tolyl)-glycine, N-methyl-N-(p-chlorophenyl)-glycine, N-ethyl-N-(p-chlorophenyl)glycine, N-(n-propyl)-N-(p-chlorophenyl)-glycine, N-methyl-N-(p-bromophenyl)-glycine, N-ethyl-N-(p-bromophenyl)-glycine, N-(n-butyl)-N-(p-bromophenyl)glycine, N,N-diphenylglycine, N-methyl-N-(p-iodophenyl)glycine and the like. Among them, those having halogen-substituted phenyl group are preferable from the viewpoint of sensitivity and storage stability.

The above-mentioned N-aryl-α-amino acids may be used either alone or in combination of two or more members.

In the photoinitiator of this invention, the ratio between the aminobenzylidene carbonyl compound of formula [I] and the N-aryl-α-amino acid of formula [II] is not particularly limited.

The photopolymerizable composition of the invention comprises:
(a) an addition-polymerizable compound having a boiling point of 100° C. or above at an atmospheric pressure, and
  (b) =photoinitiator composition which can initiate polymerization of addition-polymerizable compounds comprising:
  (1) an aminobenzylidene carbonyl compound of the formula [I], and
  (2) an N-aryl-o-amino acid of the formula [II].

As the addition-polymerizable compound (a) contained in the photopolymerizable composition, those having a boiling point of 100° C. or above at an atmospheric (ordinary) pressure are used. Those having a boiling point lower than 100° C. at ordinary pressure are undesirable from the viewpoint of characteristic properties and workability because such addition polymerizable compounds can be lost t,y vaporization when the solvent present in system is removed by drying or when the composition is exposed to active rays. Further, it is preferable to use an addition-polymerizable compound soluble into the organic solvent used in this invention, from the viewpoint of giving a homogenous composition containing photoinitiator.

Examples of the organic solvent usable include acetone, methyl ethyl ketone, toluene, chloroform, methanol, ethanol, 1,1,1-trichlorethane and the like.

As the addition-polymerizable compound having a boiling point of 100° C. or above at ordinary pressure, those prepared by condensing a polyhydric alcohol with α,β-unsaturated carboxylic acid such as diethylene glycol di(meth)acrylate (the term "di(meth)acrylate" means "diacrylate or dimethacrylate", hereinafter the same), triethylene glycol di(meth)acrylate, tetraethylene glycol di(meth)acrylate, trimethylolpropane di(meth)acrylate, trimethylolpropane tri(meth)acrylate, 1,3-propanediol di(meth)acrylate, 1,3-butanediol (meth)acrylate, pentaerythritol tetra(meth)acrylate, dipentaerythritol hexa(meth)acrylate, dipentaerythritol penta(meth)acrylate, 2,2-bis(4-acryloxydiethoxyphenyl)propane, 2,2-bis(4-methacryloxypentaethoxyphenyl)-propane and the like, those prepared by adding o,8-unsaturated carboxylic acid to a glycidyl group-containing compound such as trimethylolpropane triglycidyl ether tri(meth)acrylate, Bisphenol A diglycidyl ether di(meth)acrylate, BPE-500 (trade name, manufactured by Shin'nakamura Kagaku K.K., a mixture of 2,2-bis(4-methacryloxypolyethoxyphenyl)-propanes) and the like, unsaturated amides such as methylenebis-acrylamide, ethylenebis-acrylamide, 1,6-hexamethylenebis-acrylamide and the like, and vinyl esters such as divinyl succinate, divinyl adipate, divinyl phthalate, divinyl terephthalate, divinylbenzene-1,3-disulfonate, etc.; urethane acrylates such as 2,2,4-trimethylhexamethylene diisocyanate, an adduct of cyclohexane dimethanol and 8-hydroxyacrylate, and the like can be referred to, for example.

These addition-polymerizable compounds are used either alone or in combination of two or more members.

In the photopolymerizable composition of this invention, an addition-polymerizable compound having a boiling point of 100° C. or above at an atmospheric pressure is used in addition to the above-mentioned photoinitiator.

In the photopolymerizable composition of the invention, the aminobenzylidene carbonyl compound represented by the above-mentioned formula [I] is used preferably in an amount of 0.01 to 10 parts by weight and the N-aryl-α-amino acid represented by the above-mentioned formula [II] is used preferably in an amount of 0.05 to 20 parts by weight, both per 100 parts by weight of the addition-polymerizable compound having a boiling point of 100° C. or above at an atmospheric pressure or, when a high molecular weight organic polymer is used, per 100 parts by weight of the summed amount of said addition-polymerizable compound and said high molecular weight organic polymer.

If desired, the photopolymerizable composition of this invention may contain at least one high molecular weight organic polymer(s). As said high molecular weight organic polymer, thermoplastic high molecular weight organic polymers having a molecular weight of 10,000 to 700,000 are preferred. Its examples include the followings:

(A) Copolyesters

Copolyesters prepared from polyhydric alcohol such as diethylene glycol, triethylene glycol, tetraethylene glycol, trimethylolpropane, neopentyl glycol and the like and polybasic carboxylic acid such as terephthalic acid, isophthalic acid, sebacic acid, adipic acid and the like.

(B) Vinyl polymers

Homopolymers and copolymers of vinyl monomers such as acrylic acid, methacrylic acid, alkyl acrylates and alkyl methacrylates (e.g. methyl (meth)acrylate, ethyl (meth)acrylate, butyl (meth)acrylate and β-hydroxyethyl (meth)acrylate), styrene, vinyltoluene, vinyl chloride, vinyl butyral and the like.

(C) Polyformaldehydes (D) Polyurethanes (E) Polycarbonates (F) Nylons and polyamides (G) Cellulose esters such as methyl Cellulose and ethyl Cellulose By adding a high molecular weight organic polymer to the photopolymerizable composition, the properties of the composition such as adhesion to substrate, chemical resistance, film-formability and the like can be improved. Said high molecular weight organic polymer can be used in an amount not exceeding 80% by weight, based on the summed weight of said high molecular weight organic polymer and said additionpolymerizable compound. If its amount exceeds 80% by weight, photocuring reaction cannot progress sufficiently.

If desired, the photopolymerizable composition of this invention may contain one or more colorants such as dyes and pigments As said colorants, well known ones such as Fuchsine, Crystal Violet, Methyl Orange, Nile Blue 2B, Victoria Pure Blue, Malachite Green, Night Green B, Spiron Blue and the like can be used.

The photopolymerizable composition of this invention may contain a radical polymerization inhibitor or a radical polymerization retarder for the purpose of enhancing its stability in storage. As said inhibitor and retarder, p-methoxyphenol, hydroquinone, pyrogallol, naphthylamine, phenothiazine, aryl phosphite and the like can be used.

The photopolymerizable composition of this invention may contain other additives of which use in photopolymerizable compositions is well known, such as plasticizer, adhesion accelerator and the like.

The photopolymerizable composition of this invention is usable as a photoresist which is to be coated and dried on a support such as polyethylene terephthalate film or the like, laminated on a substrate and thereafter exposed to actinic light for production of printing plate or to be etched or plated for formation of a circuit. As the actinic light source, those emitting an actinic light having a wavelength of 300 to 600 nm are mainly used.

Examples of such light source include a carbon arc lamp, a mercury lamp, a xenon arc lamp, an argon glow lamp, an argon ion laser and the like. Supports usable for this purpose include organic polymer films such as polyethylene film, polypropylene film, polyethylene terephthalate film and the like, metallic plates such as copper plate, aluminum plate, iron plate and the like, and insulating boards prepared by lining copper foil on a substrate such as glass epoxy substrate, paper epoxy substrate, paper-phenol substrate and the like.

It is considered that, in the present invention, the compound of the formula [I] absorbs light to be excited into an oxidatively active state and it takes part in a redox reaction with the compound of the formula [II] to generate polymerization-active radical effectively, owing to which a high-sensitivity photopolymerizable composition is obtained.

The photopolymerizable composition of this invention has a high sensitivity to visible lights.

This invention is illustrated by way of the following Examples, wherein all the "parts" and "%" are by weight unless otherwise specified.

EXAMPLES 1-24 and COMPARATIVE EXAMPLES 1-18

Preparation of Photopolymerizable Composition

| | |
|---|---|
| 40% solution of acrylic polymer (methacrylic acid/methyl methacrylate/butyl methacrylate/ 2-ethylhexyl acrylate = 23/51/6/20) (parts by weight, weight average molecular weight ca. 90,000) in ethyl Cellosolve | 120 parts |
| Tetradiethylene glycol diacrylate | 25 parts |
| Hydroquinone | 0.04 part |
| Photoinitiator (see Table 1) | |
| Victoria Pure Blue | 0.8 part |
| Methyl ethyl ketone | 20 parts |

The above-mentioned ingredients of photopolymerizable composition were stirred to give a uniform solution. The resulting composition was coated onto a polyethylene terephthalate film ("Lumilar" a trade name, manufactured by Toray Industries, Inc.) having a thickness of 25 μm by the use of bar coater and dried in a hot air countercurrent type oven at 100° C. for about 3 minutes to obtain a photopolymerizable element. The dry photopolymerizable composition layer had a thickness of 40 μm.

Subsequently, the photopolymerizable element thus obtained was laminated on a copper-lined glass epoxy board having a clean surface and having a thickness of 1.6 mm by the use of a laminater, i.e. an apparatus for laminating a material by applying pressure and heat by means of rubber roll, so that the photopolymerizable composition layer came into contact with the copper surface of laminate board, at a roll temperature of 160° C.

On the polyethylene terephthalate film of the laminated sample, a step tablet (trade name Gray Scale, a negative film having 21 level differences manufactured by Dainippon Screen K.K., level difference in optical density 0.15, minimum optical density 0.05, maximum optical density 3.05) was tightly contacted and exposed for 3 seconds to the light of 3 KW ultrahigh pressure mercury lamp (trade name Phenox 3000, manufactured by ORC Seisakusho, Ltd.). As measured with ultraviolet illuminometer UV-M01 (manufactured by ORC Seisakusho, Ltd.) provided with a sensor having a spectral sensitivity maximum at 420 nm, the intensity of radiation on the irradiated surface was 21.2 mW/cm². As measured with the same illumonometer as above provided with a sensor having a spectral sensitivity maximum at 350 nm, the quantity of light exposure was 6.4 mW/cm². Then, the polyethylene terephthalate film was removed and the remainder was dipped and shaken in 2% aqueous solution of sodium carbonate at 30° C. for 40 seconds to dissolve out the uncured part. The step number of the step tablet thus obtained was taken as sensitivity of the photopolymerizable composition (a larger step number signified a higher sensitivity). In Table 1, sensitivities of samples are compared with one another.

TABLE 1

| Example No. | Photoinitiator | Amount (parts by weight) | Sensitivity (step number) |
|---|---|---|---|
| Comparative Example 1 | 2,4-Diethylthioxanthone | 1.2 | 5.6 |
| Comparative Example 2 | Benzophenone | 4.0 | 2.8 |
| Comparative Example 3 | Riboflavin tetrabutyrate | 1.0 | 5.0 |
| Comparative Example 4 | 2-Ethylanthraquinone | 3.0 | 8.0 |
| Comparative Example 5 | Michler's ketone | 0.2 | 0 |
| Comparative Example 6 | K-1 | 0.2 | 0 |
| Comparative Example 7 | K-2 | 0.2 | 0 |
| Comparative Example 8 | K-3 | 0.2 | 0 |
| Comparative Example 9 | 7-Methoxy-3-benzoylcoumarin | 0.2 | 0 |
| Comparative Example 10 | K-1<br>Ethyl 4-dimethylaminobenzoate | 0.2<br>4.0 | 0 |
| Comparative Example 11 | K-2<br>Ethyl 4-dimethylaminobenzoate | 0.2<br>4.0 | 0 |
| Comparative Example 12 | K-3<br>Ethyl 4-dimethylaminobenzoate | 0.2<br>4.0 | 0 |
| Example 1 | K-1<br>N-Methyl-N-phenylglycine | 0.2<br>2.0 | 12.0 |
| Example 2 | K-1<br>N-Ethyl-N-(p-chlorophenyl)-glycine | 0.2<br>2.0 | 13.0 |
| Example 3 | K-2<br>N-Methyl-N-phenylglycine | 0.2<br>2.0 | 16.0 |
| Example 4 | K-2<br>N-Ethyl-N-(p-chlorophenyl)-glycine | 0.2<br>2.0 | 17.0 |
| Example 5 | K-2<br>N-Ethyl-N-(p-chlorophenyl)-glycine | 0.2<br>4.0 | 18.5 |
| Example 6 | K-3<br>N-Methyl-N-phenylglycine | 0.2<br>2.0 | 12.0 |
| Example 7 | K-3<br>N-Ethyl-N-(p-chlorophenyl)-glycine | 0.2<br>2.0 | 13.0 |
| Example 8 | K-3<br>N-Ethyl-N-(p-chlorophenyl)-glycine | 0.2<br>4.0 | 14.5 |
| Example 9 | K-2<br>N-n-Butyl-N-phenylglycine | 0.2<br>2.0 | 16.0 |
| Example 10 | K-2<br>N-n-Butyl-N-(p-bromophenyl)-glycine | 0.2<br>2.0 | 16.0 |
| Comparative Example 13 | K-4 | 0.2 | 0 |
| Comparative Example 14 | K-5 | 0.2 | 0 |
| Comparative Example 15 | K-6 | 0.2 | 0 |
| Comparative Example 16 | K-4<br>Ethyl 4-dimethylaminobenzoate | 0.2<br>4.0 | 0 |
| Comparative Example 17 | K-5<br>Ethyl 4-dimethylaminobenzoate | 0.2<br>4.0 | 0 |
| Comparative Example 18 | K-6<br>Ethyl 4-dimethylaminobenzoate | 0.2<br>4.0 | 0 |
| Example 11 | K-4<br>N-Methyl-N-phenylglycine | 0.2<br>2.0 | 14.0 |
| Example 12 | K-4<br>N-Ethyl-N-(p-chlorophenyl)glycine | 0.2<br>2.0 | 13.5 |
| Example 13 | K-5<br>N-Methyl-N-phenylglycine | 0.2<br>2.0 | 14.5 |
| Example 14 | K-5<br>N-Ethyl-N-(p-chlorophenyl)glycine | 0.2<br>2.0 | 15.5 |
| Example 15 | K-5<br>N-Ethyl-N-(p-chlorophenyl)glycine | 0.2<br>4.0 | 18.0 |
| Example 16 | K-6<br>N-Methyl-N-phenylglycine | 0.2<br>2.0 | 14.5 |
| Example 17 | K-6<br>N-Ethyl-N-(p-chlorophenyl)glycine | 0.2<br>2.0 | 14.5 |
| Example 18 | K-6<br>N-Ethyl-N-(p-chlorophenyl)glycine | 0.2<br>4.0 | 16.0 |
| Example 19 | K-5<br>N-n-Butyl-N-phenylglycine | 0.2<br>2.0 | 18.0 |
| Example 20 | K-5 | 0.2 | 18.0 |

TABLE 1-continued

| Example No. | Photoinitiator | Amount (parts by weight) | Sensitivity (step number) |
|---|---|---|---|
| | N-n-Butyl-N-(p-bromophenyl)glycine | 2.0 | |

(Note)
(Compound names and structures of K-1, K-2 and K-3 are shown in Table 2.)
K-4: 3,5-Bis(p-N,N-diethylaminophenylmethylene)-1-acetyl-4-piperidinone
K-5: 3,5-Bis(p-N,N-diethylaminophenylmethylene)-1-benzoyl-4-piperidinone
K-6: 3,5-Bis(p-N,N-diethylaminophenylmethylene)-1-ethoxycarbonyl-4-piperidinone Table 1 demonstrates that the samples of the examples of the present invention have high sensitivities.

Among the aminobenzylidene carbonyl compounds shown in Table 1, 2,6-bis(p-N,N-diethylaminobenzylidene)-4-methyl-4-azacyclohexanone (K-2) was synthesized in the following manner. The other compounds were also synthesized in a similar manner.

Synthesis of 2,6-Bis(p-N,N-diethylaminobenzylidene)-4-methyl-4-azacyclohexanone (K-2)

Two grams (17.7 mmoles) of N-methyl-4-piperidone and 6.26 g (35.4 mmoles) of p-N,N-diethylaminobenzaldehyde were introduced into a 100 ml eggplant type flask, to which was added a solution of 0.5 g of sodium hydroxide in 50 ml methanol. The contents of the flask equipped with a reflux condenser were heated under reflux for about one hour with stirring by means of a magnetic stirrer. After allowing the reaction mixture to cool, the deposited organge-colored crystalline product was collected by filtration and thoroughly washed with methanol. Then, it was purified by recrystallization from benzene/chloroform.

$H^1$-NMR data (solvent: deuterochloroform, internal standard tetramethylsilane) of the aminobenzylidene carbonyl compound thus synthesized and its light absorption characteristics in methanol in ultraviolet and visible regions are shown in Table 2 and Table 3, respectively.

TABLE 3-continued

| | Ultraviolet and visible light absorption characteristics in methanol | | |
|---|---|---|---|
| Abbreviation | K-1 | K-2 | K-3 |
| 488 nm | 17,470 | 39,350 | 23,800 |

What is claimed is:

1. A photoinitiator composition comprising
(1) an aminobenzylidene carbonyl compound represented by the formula:

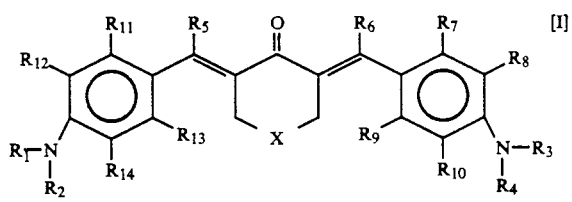

[I]

wherein $R_1$, $R_2$, $R_3$ and $R_4$ are independently an alkyl group having 1 to 6 carbon atoms; $R_5$ and $R_6$ are independently a hydrogen atom, a cyano group, an alkoxycarbonyl group having 2 to 8 carbon atoms, an alkyl group having 1 to 12 carbon atoms or an aryl group; $R_7$, $R_8$, $R_9$, $R_{10}$, $R_{11}$, $R_{12}$, $R_{13}$ and $R_{14}$ are independently a hydrogen atom, a chlorine atom, a bromine atom, an alkyl group having 1 to 12 carbon

TABLE 2

| | $H^1$-NMR data (ppm) | | |
|---|---|---|---|
| Abbreviation | K-1 | K-2 | K-3 |
| Compound name | 2,6-Bis(p-diethylaminobenzylidene)-4-thiacyclohexanone | 2,6-Bis(p-diethylaminobenzylidene)-4-aza-4-methylcyclohexanone | 2,6-Bis(p-diethylaminobenzylidene)-4-oxocyclohexanone |
| Structure | (structure with S) | (structure with N-Me) | (structure with O) |
| N-Alkyl | 1.19(Me, t, J=7.3 Hz, 12H) 3.40(CH$_2$, q, J=7.3 Hz, 8H) | 1.19(Me, t, J=7.0 Hz, 12H) 3.40(CH$_2$, q, J=7.0 Hz, 8H) | 1.19(Me, t, J=7.0 Hz, 12H) 3.40(CH$_2$, q, J=7.0 Hz, 8H) |
| Aryl | 6.67(Ha, d, J=9.2 Hz, 4H) 7.35(Hb, d, J=8.9 Hz, 4H) | 6.67(Ha, d, Jab=9.85 Hz, 4H) 7.33(Hb, d, Jab=9.85 Hz, 4H) | 6.67(Ha, d, Jab=8.85 Hz, 4H) 7.24(Hb, d, Jab=8.85 Hz, 4H) |
| Methine | 7.74(Hc, s, 2H) | 7.74(Hc, s, 2H) | 7.75(s, 2H) |
| Others | 3.98(Hd, s, 4H) | 2.50(N—Me, s, 3H) 3.79(Hd, d, 1.22 Hz, 4H) | 4.95(Hd, d, J=1.53 Hz, 4H) |

TABLE 3

| | Ultraviolet and visible light absorption characteristics in methanol | | |
|---|---|---|---|
| Abbreviation | K-1 | K-2 | K-3 |
| $\lambda_{max}$ (nm) in MeOH | 203.6 272.1 454.0 | 205.2 279.4 467.0 | 204.6 279.3 473.0 |
| $\epsilon$ | | | |
| 435 nm | 22,940 | 62,400 | 17,650 | atoms, an aryl group or an alkoxy group having 1 to 12 carbon atoms; and X is an oxygen atom, a sulfur atom, —NH— or nitrogen atom substituted by an alkyl group having 1 to 12 carbon atoms, an aralkyl group having 1 to 12 carbon atoms, an aryl group, an acyl group having 1 to 12 carbon atoms, an alkoxycarbonyl group having 1 to 12 carbon atoms, an arylcarbonyl group having 7 to 20 carbon atoms, or an aryloxycarbonyl group having 7 to 20 carbon atoms, and (2) an N-aryl-α-amino acid represented by the formula:

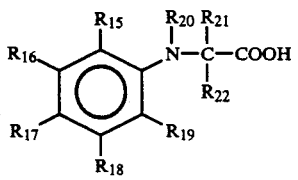

wherein $R_{15}$, $R_{16}$, $R_{17}$, $R_{18}$ and $R_{19}$ are independently a hydrogen atom, an alkyl group having 1 to 12 carbon atoms or a halogen atom; $R_{20}$ is a hydrogen atom, an alkyl group having 1 to 12 carbon atoms, a cycloalkyl group, a hydroxyalkyl group having 1 to 12 carbon atoms, an alkoxyalkyl group having 1 to 12 carbon atoms, an aminoalkyl group having 1 to 12 carbon atoms or an aryl group; and $R_{21}$ and $R_{22}$ are independently a hydrogen atom or an alkyl group having 1 to 8 carbon atoms.

2. A photoinitiator composition according to claim 1, wherein said aminobenzylidene carbonyl compound represented by formula [I] is a compound of formula [I] of which X is nitrogen atom substituted by an alkyl group having 1 to 12 carbon atoms or an aralkyl group having 1 to 12 carbon atoms.

3. A photopolymerizable composition comprising:
(a) an addition-polymerizable compound having a boiling point of 100° C. or higher at an atmospheric pressure, and
(b) a photoinitiator composition comprising
  (1) an aminobenzylidene carbonyl compound represented by the formula:

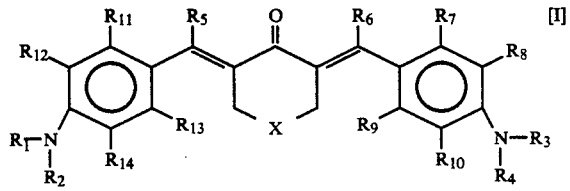

wherein $R_1$, $R_2$, $R_3$ and $R_4$ are independently an alkyl group having 1 to 6 carbon atoms; $R_5$ and $R_6$ are independently a hydrogen atom, a cyano group, an alkoxycarbonyl group having 2 to 8 carbon atoms, an alkyl group having 1 to 12 carbon atoms or an aryl group; $R_7$, $R_8$, $R_9$, $R_{10}$, $R_{11}$, $R_{12}$, $R_{13}$ and $R_{14}$ are independently a hydrogen atom, a chlorine atom, a bromine atom, an alkyl group having 1 to 12 carbon atoms, an aryl group or an alkoxy group having 1 to 12 carbon atoms; and X is an oxygen atom, a sulfur atom, —NH— or nitrogen atom substituted by an alkyl group having 1 to 12 carbon atoms, an aralkyl group having 1 to 12 carbon atoms, an aryl group, an acyl group having 1 to 12 carbon atoms, an alkoxycarbonyl group having 1 to 12 carbon atoms, an arylcarbonyl group having 7 to 20 carbon atoms, or an aryloxycarbonyl group having 7 to 20 carbon atoms, and (2) an N-aryl-α-amino acid represented by the formula:

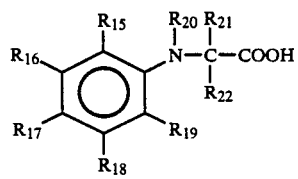

wherein $R_{15}$, $R_{16}$, $R_{17}$, $R_{18}$ and $R_{19}$ are independently a hydrogen atom, an alkyl group having 1 to 12 carbon atoms or a halogen atom; R20 is a hydrogen atom, an alkyl group having 1 to 12 carbon atoms, a cycloalkyl group, a hydroxyalkyl group having 1 to 12 carbon atoms, an alkoxyalkyl group having 1 to 12 carbon atoms, an aminoalkyl group having 1 to 12 carbon atoms or an aryl group; and $R_{21}$ and $R_{22}$ are independently a hydrogen atom or an alkyl group having 1 to 8 carbon atoms.

4. A photopolymerizable composition according to claim 3, wherein there is contained a high molecular weight organic polymer in an amount of 80% by weight based on the total weight of said high molecular weight organic polymer and the addition-polymerizable compound.

5. A photopolymerizable composition according to claim 4, wherein said aminobenzylidene carbonyl compound represented by formula [I] is a compound of formula [I] of which X is a nitrogen atom substituted by an alkyl group having 1 to 12 carbon atoms or an aralkyl group having 1 to 12 carbon atoms.

6. A photoinitiator composition according to claim 1, wherein said photoinitiator composition can initiate polymerization of addition-polymerizable compounds.

7. A photopolymerizable composition according to claim 3, wherein said photoinitiator composition can initiate polymerization of said addition-polymerizable compound.

* * * * *